United States Patent

Komatsu et al.

[11] Patent Number: 6,146,815
[45] Date of Patent: Nov. 14, 2000

[54] DEVELOPER FOR PHOTOSENSITIVE POLYIMIDE PRECURSOR, AND METHOD OF USING IT FOR PATTERNING

[75] Inventors: Hiroshi Komatsu; Takeharu Motobe, both of Ibaraki, Japan

[73] Assignees: Hitachi Chemical DuPont Microsystems L.L.C., Wilmington, Del.; Hitachi Chemical DuPont Microsystems Ltd., Tokyo, Japan

[21] Appl. No.: 09/262,532

[22] Filed: Mar. 4, 1999

[30] Foreign Application Priority Data

| Mar. 5, 1998 | [JP] | Japan | ................................. | 10-053013 |
| May 29, 1998 | [JP] | Japan | ................................. | 10-149946 |

[51] Int. Cl.$^7$ ....................................................... G03F 7/32
[52] U.S. Cl. ............................................................. 430/331
[58] Field of Search ............................................... 430/331

[56] References Cited

U.S. PATENT DOCUMENTS

| 3,993,489 | 11/1976 | Heimsch et al. | ........................... | 430/14 |
| 4,081,332 | 3/1978 | Hein | ......................................... | 203/51 |
| 4,547,455 | 10/1985 | Hiramoto et al. | ....................... | 430/325 |
| 4,734,821 | 3/1988 | Morimoto et al. | ....................... | 361/433 |
| 5,317,082 | 5/1994 | Beuhler et al. | .......................... | 528/353 |
| 5,910,385 | 6/1999 | Gardner et al. | ........................... | 430/62 |
| 6,071,868 | 6/2000 | Kim et al. | ............................... | 510/176 |

FOREIGN PATENT DOCUMENTS

| 0 475 086 | 3/1992 | European Pat. Off. . |
| 0 505 161 | 9/1992 | European Pat. Off. . |
| 0 704 743 | 9/1995 | European Pat. Off. . |
| 62-269955 | 11/1987 | Japan | ................................ | G03F 7/32 |
| 64-42653 | 2/1989 | Japan . |
| 3-188449 | 8/1991 | Japan . |
| 7-271053 | 10/1995 | Japan | ................................ | G03F 7/32 |
| 10-123725 | 5/1998 | Japan | ................................ | G03F 7/32 |
| 2 107 889 | 5/1983 | United Kingdom . |

OTHER PUBLICATIONS

Japanese Abstract 10 42653A, Feb. 1989.
Interchemical Review, vol. 14, No. 1, 1955, pp. 3–16; "Solubility Parameters, Part I", Harry Burrell, XP002134913.
Interchemical Review, vol. 14, No. 2, 1955, pp. 31–46; "Solubility Parameters, Part II", Harry Burrell, XP002134914.

*Primary Examiner*—Hoa Van Le
*Attorney, Agent, or Firm*—Griffin & Szipl, P.C.

[57] ABSTRACT

The invention provides a developer for photosensitive polyimides, with which polyimide patterning for interlayer insulating films for multi-layered circuit boards and for α-ray shield layers, buffer coat layers and others for semiconductor memory devices is attained within a shorter period of time than with conventional developers. It provides a developer for photosensitive polyimide precursors, which comprises two or more solvents including at least an aprotic polar solvent, and in which the mixed solution of the solvents has a polar component solubility parameter, $\delta P$, of not smaller than 7, and provides a patterning method of using the developer.

8 Claims, No Drawings

DEVELOPER FOR PHOTOSENSITIVE POLYIMIDE PRECURSOR, AND METHOD OF USING IT FOR PATTERNING

BACKGROUND OF THE INVENTION

1. Field of the Invention

The present invention relates to a developer for photosensitive polyimide precursors, and to a method of using it for patterning.

2. Description of the Related Art

In recent semiconductor industries, organic substances with good heat resistance such as polyimide resins and the like are being used as interlayer insulating materials, because of their good characteristics, in place of conventional inorganic materials.

Circuit patterning for semiconductor integrated circuits and printed circuits requires many complicated steps of, for example, forming a resist film on the surface of a substrate, removing the unnecessary part of the film through selective exposure and etching at a predetermined site, and rinsing the surface of the thus-processed substrate. For this, therefore, it is desired to develop heat-resistant photosensitive materials for resists that can be directly used as insulating layers after having been patterned through exposure and development.

For those, for example, heat-resistant photosensitive materials comprising, as the base polymer, photosensitive polyimide, cyclic polybutadiene or the like have been proposed. Above all, photosensitive polyimides are specifically noticed for those materials, as their heat resistance is good and impurities are easy to remove from them.

However, the base polymer itself of conventional photosensitive polyimides is poorly soluble in organic solvents. Therefore, patterning a film of such a poorly-soluble, photosensitive polyimide material with a conventional developer for photosensitive polyimide precursors to give good patterns often takes a lot of time for development. In addition, if the development time for it is not adequately settled, some undesired residues will remain after the development.

With the recent tendency toward the reduction in processing time in the art, a one-mask process is being employed in which the polyimide pattern formed is directly used as a mask and the underlying passivation film is etched via the mask. In this case, the polyimide pattern formed is required to be a good mask with dimensional accuracy with little fluctuation.

SUMMARY OF THE INVENTION

The present invention is to provide a developer for photosensitive polyimides, with which polyimide patterning, for example, for interlayer insulating films for multi-layered circuit boards and for α-ray shield layers, buffer coat layers and others for semiconductor memory devices is attained within a shorter period of time than with conventional developers.

In addition to its characteristic noted above, the developer, which the invention is to provide, is further characterized in that the polyimide patterns formed with it have the advantage of little fluctuation in patterning dimensions.

The developer is still further characterized in that it gives no residues after development with it, and that the difference in the solution velocity between the exposed area and the non-exposed area being developed with it is great enough to give high-resolution patterns.

Another aspect of the invention is to provide a method of using the developer for polyimide patterning for interlayer insulating films for multi-layered circuit boards and for α-ray shield layers, buffer coat layers and others for semiconductor memory devices. In the method, the polyimide patterning with the developer is attained within a shorter period of time than with conventional developers, and, in addition, the developer used gives no residues after development with it, and the polyimide patterns formed have the advantage of little fluctuation in patterning dimensions.

Specifically, the invention that attains the objects noted above provides a developer for photosensitive polyimide precursors, which comprises two or more solvents including at least an aprotic polar solvent, and in which the mixed solution of the solvents has a polar component solubility parameter, δP, of not smaller than 7.

In one embodiment of the developer of the invention that comprises at least two or more solvents, the mixed solution of the solvents has a polar component solubility parameter, δP, falling between 7 and 9, and a hydrogen-bond component solubility parameter, δH, falling between 5 and 7.

In another embodiment of the invention, each solvent that constitutes the developer has a vapor pressure of not higher than 30 mmHg (at 25° C.).

In still another embodiment, each solvent has a polar component solubility parameter, δP, of not smaller than 7.

In still another embodiment, the developer comprises two aprotic polar solvents each having a dipole moment of not smaller than 3.8, in a compositional ratio falling between 0.5 and 2.0, along with water.

In still another embodiment, the developer comprises from 80 to 95% by weight of an aprotic polar solvent and from 5 to 12% by weight of water.

In still another embodiment of the developer, the aprotic polar solvent is comprised of dimethylsulfoxide and γ-butyrolactone, and the developer contains from 30 to 70% by weight of dimethylsulfoxide, from 30 to 70% by weight of γ-butyrolactone and from 5 to 12% by weight of water in a ratio by weight of dimethylsulfoxide/γ-butyrolactone falling between 0.6 and 1.5.

The invention further provides a patterning method, which comprises exposing a film of a photosensitive polyimide precursor composition to active rays via a pattern mask therebetween, followed by processing the film with the developer noted above to thereby remove the non-exposed area of the film.

DESCRIPTION OF THE PREFERRED EMBODIMENTS

The developer for photosensitive polyimide precursors of the invention comprises two or more solvents including at least an aprotic polar solvent, in which the mixed solution of the solvents has a polar component solubility parameter, δP, of not smaller than 7. Having the specific composition, the developer exhibits improved solubility, while having a significant effect in enlarging the difference in solution velocity between the exposed area and the non-exposed area being developed with it. If the developer comprises only one solvent, controlling the difference in solution velocity between the exposed area and the non-exposed area being developed with it is difficult, and therefore good patterns could not be formed. If the mixed solution of the solvents constituting the developer has a polar component solubility parameter of smaller than 7, the developer could not have a satisfactory degree of solubility, and the difference in solution velocity between the exposed area and the non-exposed area being developed with it could not reach a satisfactory level.

The polar component solubility parameter as referred to herein is a characteristic value of liquid as defined by Hildebrand. This is calculated from the cohesive energy and the molecular volume of a polar component, and is known specific to each solvent. For mixed solvents, the solubility parameter intrinsic to each constituent solvent is apportioned relative to the volume fraction of each solvent constituting the mixture, and the resulting data are summed up to give the solubility parameter of the mixed solvent.

To control the solvent mixture so as to make it have a polar component solubility parameter of not smaller than 7, the type of the aprotic solvents and other solvents to be used and also their amounts to be mixed shall be so selected that the resulting mixture could have the value of not smaller than 7 as calculated according to the calculation formula noted above.

The aprotic polar solvent for use in the invention must be such that the solvent mixture comprising it has a calculated solubility parameter, $\delta P$, of not smaller than 7. The solvent having $\delta P$ of not smaller than 7 by itself includes, for example, dimethylsulfoxide, methylsulfone, trimethyl phosphate, γ-butyrolactone, ethylene carbonate, acetonitrile, propionitrile, nitroethane, etc. The others each having $\delta P$ of smaller than 7 by itself but capable of being used when combined with any of those with $\delta P$ of not smaller than 7 mentioned above include, for example, N-methyl-2-pyrrolidone, N,N-dimethylacetamide, N,N-dimethylformamide, etc.

Any other solvent except aprotic polar solvents may be combined with the aprotic polar solvent to prepare the developer of the invention. Such other solvents include, for example, water, alcohols such as methanol, ethanol, ethylene glycol, etc.

In the invention, it is desirable that the developer has a polar component solubility parameter, $\delta P$, falling between 7 and 9 and a hydrogen-bond component solubility parameter, $\delta H$, falling between 5 and 7, as being more effective in increasing its solution velocity while favorably controlling it to fall within a predetermined range.

The hydrogen-bond component solubility parameter, $\delta H$, as referred to herein is a characteristic value of liquid as defined by Hildebrand. This is calculated from the cohesive energy and the molecular volume of a hydrogen-bond component, and is known specific to each solvent. For mixed solvents, their hydrogen-bond solubility parameter may be obtained in the same manner as hereinabove mentioned for the polar component solubility parameter of mixed solvents.

In the invention, it is also desirable that each solvent constituting the developer has a vapor pressure of not higher than 30 mmHg (at 25° C.), as the composition of the developer varies little and the temperature thereof lowers little during development. Using the developer brings about little fluctuation in patterning dimensions. The solvent having a vapor pressure of not higher than 30 mmHg (at 25° C.) includes, for example, dimethylsulfoxide, methylsulfone, trimethyl phosphate, γ-butyrolactone, ethylene carbonate, nitroethane, N-methyl-2-pyrrolidone, N,N-dimethylacetamide, N,N-dimethylformamide, water, etc. The vapor pressure of the solvent may be measured in a static method or the like.

It is more desirable that the solvents constituting the developer that satisfies the conditions of $\delta P$ and $\delta H$ noted above each independently have a polar component solubility parameter, $\delta P$, of not smaller than 7, as a high degree of resolution could be expected in patterning with the developer. As examples of such solvents, mentioned are dimethylsulfoxide, methylsulfone, trimethyl phosphate, γ-butyrolactone, ethylene carbonate, acetonitrile, propionitrile, nitroethane, water, etc. These organic solvents could be used either singly or as combined.

Therefore, it is especially preferable that each solvent in the developer has a vapor pressure of not higher than 30 mmHg (at 25° C.) and has a polar component solubility parameter, $\delta P$, of not smaller than 7, as high-resolution patterning could be realized to give patterns with little fluctuation in patterning dimensions. As examples of the preferred solvents, mentioned are dimethyl-sulfoxide, methylsulfone trimethyl phosphate, γ-butyrolactone, ethylene carbonate, nitroethane, water, etc.

It is also desirable that at least one solvent in the developer has a hydrogen-bond component solubility parameter, $\delta H$, of not smaller than 10, as much improving the solubility of the developer comprising it. The solvent of that type includes, for example, water, glycerol, ethylene glycol, methanol, ethanolamine, etc. Of those, especially preferred are the solvents (water, etc.) having a polar component solubility parameter, $\delta P$, of not smaller than 7, for the reasons noted above.

For its better condition, it is further desirable that the developer of the invention comprises from 80 to 95% by weight of two aprotic polar solvents each independently having a dipole moment of not smaller than 3.8, in a compositional ratio by weight falling between 0.5 and 2.0, and from 5 to 12% by weight of water, since the developer in such a preferred condition could exhibit increased solution velocity while favorably controlling it to fall within a predetermined range, and since it gives no residues after development with it. If the developer does not satisfy the preferred range noted above, its solution velocity will lower and it will give some residues after development with it. In that condition, even if the developer contains any additional components, it shall still satisfy the requirements noted above in order to attain the intended results.

The aprotic polar solvent having a dipole moment of not smaller than 3.8 includes, for example, dimethylsulfoxide, γ-butyrolactone, etc. In general, the dipole moment of a solvent may be calculated through measurement of the dielectric constant and the density thereof, in accordance with the Debye's formula. The dipole moment of many solvents is known.

Of those mentioned hereinabove, one preferred embodiment of the developer of the invention comprises from 30 to 70% by weight of dimethylsulfoxide, from 30 to 70% by weight of γ-butyrolactone and from 5 to 12% by weight of water in a ratio by weight of dimethylsulfoxide/γ-butyrolactone falling between 0.6 and 1.5, since the difference in the solution velocity between the exposed area and the non-exposed area being developed with it is great enough to give high-resolution patterns. More preferably, it comprises from 35 to 45% by weight of dimethylsulfoxide, from 50 to 60% by weight of γ-butyrolactone and from 7.5 to 9% by weight of water in a ratio by weight of dimethylsulfoxide/γ-butyrolactone falling between 0.6 and 0.9, since it has a lot of latitude in the time for development with it and since it gives no residues after development with it.

The photosensitive polyimide precursors to which the developer of the invention is directed are preferably in the form of a so-called negative, photosensitive polyimide precursor composition having a photosensitive group capable of being dimerized or polymerized in light. As a result of dimerization or polymerization of the photosensitive group therein, the exposed area of the composition becomes insoluble or hardly soluble in the developer of the invention.

The photosensitive polyimide precursors of that type include, for example, those having repetitive units of the following general formula (1) to be formed from a tetracarboxylic acid or its derivative and a diamine as bonded through amido bonding.

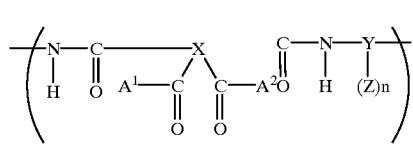

(I)

wherein X represents a tetravalent organic group; Y represents a divalent organic group; $A^1$ and $A^2$ each independently represent OH, $OR^1$, $NHR^2$ or $HR^3R^4R^5$; $R^1$, $R^2$, $R^3$, $R^4$ and $R^5$ each represent a monovalent organic group; Z represents a monovalent organic group having an unsaturated carbon-carbon double bond; n represents 0, 1 or 2; and when n is 0, then $A^1$ and $A^2$ each independently represent $OR^1$, $NHR^2$, or $O^-N^+HR^3R^4R^5$, and $R^1$, $R^2$ and $R^3$ each represent a monovalent organic group having an unsaturated carbon-carbon double bond.

In formula (I), X generally indicates a residue of a tetracarboxylic acid or its derivative such as its anhydride or the like capable of reacting with a diamine to form a polyimide precursor, and preferably contains an aromatic ring. Y generally indicates a residue of a diamine capable of reacting with a tetracarboxylic acid or its derivative to form a polyimide precursor, and preferably contains an aromatic ring or a siloxane bond. It is desirable that these residues each have from 6 to 80 carbons in total. The aromatic ring includes, for example, benzene ring, naphthalene ring, pyridine ring, etc. X and Y may have one aromatic rings or from 2 to 10 aromatic rings as bonded to each other via a single bond, an ether group, an alkylene group, a fluoroalkylene group, a sulfonyl group, a sulfoxyl group (—SO—), a carbonyl group or the like. In these, the aromatic ring may have a substituent of, for example, a hydrocarbon group, a halogenated hydrocarbon group, a halogen atom and the like.

$R^1$, $R^2$, $R^3$, $R^4$ and $R^5$ having an unsaturated carbon—carbon double bond may be selected from monovalent organic groups of a formula:

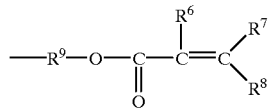

wherein $R^6$, $R^7$ and $R^8$ each represent a group independently selected from a hydrogen atom, an alkyl group, a phenyl group, a vinyl group and a propenyl group; $R^9$ represents a divalent organic group.

The alkyl group may have from 1 to 4 carbon atoms. The divalent organic group for $R^9$ may be an alkylene group having from 1 to 4 carbon atoms, such as a methylene group, an ethylene group, a propylene group or the like. It is desirable that the groups of —$COA^1$ and —$COA^2$ and the two amido groups bonding to X all bond directly to the aromatic group of X. In that case, it is further desirable that the groups of —$COA^1$ and —$COA^2$ are ortho- or peri-positioned relative to either one of the amido groups.

The group of Z may have a moiety of a vinyl group, an allyl group, an acryloyl group, a methacryloyl group or the like.

The polyimide precursors mentioned above may be prepared from starting compounds of a tetracarboxylic acid or its derivative (its dianhydride or the like), a diamine and optionally a compound having a photosensitive group.

The tetracarboxylic acid dianhydride includes, for example, pyromellitic anhydride, 3,3',4,4'-benzophenone-tetracarboxylic acid dianhydride, 3,3',4,4'-biphenyl-tetracarboxylic acid dianhydride, 1,2,5,6-naphthalene-tetracarboxylic acid dianhydride, 2,3,6,7-naphthalene-tetracarboxylic acid dianhydride, 2,3,5,6-pyridine-tetracarboxylic acid dianhydride, 1,4,5,8-naphthalene-tetracarboxylic acid dianhydride, 3,4,9,10-perylene-tetracarboxylic acid dianhydride, 4,4'-sulfonyldiphthalic acid dianhydride, m-terphenyl-3,3'',4,4''-tetracarboxylic acid dianhydride, p-terphenyl-3,3'',4,4''-tetracarboxylic acid dianhydride, 4,4'-hydroxydiphthalic acid dianhydride, 1,1,1,3,3,3-hexafluoro-2,2-bis(2,3-dicarboxyphenyl)propane dianhydride, 2,2-bis(2,3-dicarboxyphenyl)propane dianhydride, 2,2-bis(3,4-dicarboxy-phenyl)propane dianhydride, 1,1,1,3,3,3-hexafluoro-2,2'-bis[4-(2,3-dicarboxy-phenoxy)phenyl]propane dianhydride, 1,1,1,3,3,3-hexafluoro-2,2'-bis[4-(3,4-dicarboxyphenoxy)phenyl]propane dianhydride, etc.

The diamine includes, for example, aromatic diamines such as p-phenylenediamine, m-phenylenediamine, p-xylylenediamine, m-xylylenediamine, 1,5-diaminonaphthalene, benzidine, 3,3'-dimethylbenzidine, 3,3'-dimethoxybenzidine, 4,4'- (or 3,4'-, 3,3'-, 2,4'-) diaminodiphenylmethane, 4,4'- (or 3,4'-, 3,3'-, 2,4'-) diaminodiphenyl ether, 4,4'- (or 3,4'-, 3,3'-, 2,4'-)diamino-diphenylsulfone, 4,4'- (or 3,4'-, 3,3'-, 2,4'-)diaminodiphenyl sulfide, 4,4'-benzophenone-diamine, 3,3'-benzophenone-diamine, 4,4'-di(4-aminophenoxy)phenyl-sulfone, 4,4'-bis (4-aminophenoxy)biphenyl, 1,4-bis(4-aminophenoxy) benzene, 1,3-bis(4-aminophenoxy)benzene, 1,1,1,3,3,3-hexafluoro-2,2-bis(4-aminophenyl)-propane, 2,2-bis[4-(4-aminophenoxy)phenyl]propane, 3,3-dimethyl-4,4'-diamino-diphenylmethane, 3,3',5,5'-tetramethyl-4,4'-diaminodiphenylmethane, 4,4'-di(3-aminophenoxy) phenylsulfone, 3,3'-diaminodiphenylsulfone, 2,2'-bis(4-aminophenyl)propane, 2-methyl-4,4'-diaminobiphenyl, 3-methyl-4,4'-diaminobiphenyl, 2,2'-dimethyl-3,3'-diaminobiphenyl, 2,2'-dimethyl-4,4'-diaminobiphenyl, 2,2', 6,6'-tetramethyl-3,3'-diaminobiphenyl, 2,2',6,6'-tetramethyl-4,4'-diaminobiphenyl, etc.; heterocyclic diamines such as 2,6-diaminopyridine, 2,4-diaminopyrimidine, 2,4-diamino-s-triazine, 2,7-diaminobenzofuran, 2,7-diaminocarbazole, 3,7-diaminophenothiazine, 2,5-diamino-1,3,4-thiadiazole, 2,4-diamino-6-phenyl-s-triazine, etc.; trimethylenediamine, tetramethylenediamine, hexamethylenediamine, 2,2-dimethylpropylenediamine, diaminopolysiloxanes of the following formula, etc.

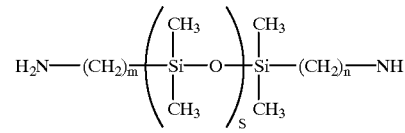

wherein m and n each independently represent an integer of from 1 to 10, and s represents an integer of from 1 to 10.

The tetracarboxylic acid dianhydrides as well as the diamine compounds mentioned above are used either singly or as combined.

To prepare the polyimide precursors having a photosensitive group, for example, employed is a method of reacting a compound having an unsaturated carbon-carbon double bond and an amino or quaternated amino group with a polyamic acid in such a manner that the amino or quaternated amino group in the former and the carboxyl group in the latter give an ionic bond; or a method of introducing an unsaturated carbon—carbon double bond into a polyimide precursor at its side chain via a covalent bond such as an ester bond, an amido bond or the like therebetween.

The developer of the invention is especially favorable for development of a composition that contains a photosensitive polyimide precursor having an unsaturated carbon-carbon double bond as introduced thereinto via ionic bonding.

In the method of introducing an unsaturated carbon-carbon double bond into a polyimide precursor via ionic bonding, it is desirable that the amount of the compound having an unsaturated carbon-carbon double bond and an amino or quatemated amino group to be used falls within a range of (an equimolar amount ±50 mol %) relative to the carboxyl group of the polyamic acid to be reacted with the compound, in view of the photo-curability and the heat resistance of the photosensitive polyimide precursor produced.

As examples of the compound having an unsaturated carbon-carbon double bond and an amino or quaternated amino group, mentioned are the following:

N,N-dimethylaminoethyl acrylate, N,N-dimethylaminopropyl acrylate, N,N-dimethylaminoethyl methacrylate, N,N-dimethylaminopropyl methacrylate, N,N-dimethylaminobutyl acrylate, N,N-dimethylaminobutyl methacrylate, N,N-diethylaminoethyl acrylate, N,N-diethylaminopropyl acrylate, N,N-diethylaminoethyl methacrylate, N,N-diethylaminopropyl methacrylate, N,N-diethylaminobutyl acrylate, N,N-diethylaminobutyl methacrylate.

The photosensitive polyimide precursor composition to be processed with the developer of the invention generally contains a photo-initiator. The photo-initiator includes, for example, Michler's ketone, benzoin methyl ether, benzoin ethyl ether, benzoin isopropyl ether, 2-t-butylanthraquinone, 2-ethylanthraquinone, 4,4'-bis(diethylamino)benzophenone, acetophenone, benzophenone, thioxanthone, 2,2-dimethoxy-2-phenylacetophenone, I-hydroxycyclohexyl phenyl ketone, 2-methyl-[4-(methylthio)phenyl]-2-morpholino-1-propanone, benzil, diphenyl disulfide, phenanthrenequinone, 2-isopropylthioxanthone, riboflavin tetrabutyrate, 2,6-bis(p-diethylaminobenzal)-4-methyl-4-azacyclohexanone, N-ethyl-N-(p-chlorophenyl)glycine, N-phenyldiethanolamine, 2-(o-ethoxy-carbonyl)oxyimino-1,3-diphenylpropane-dione, 1-phenyl-2-(o-ethoxycarbonyl)-oxyiminopropan-1-one, 3,3,4,4-tetra(t-butylperoxycarbonyl)benzophenone, 7-diethylamino-3-thenoylcoumarin, 3,3-carbonylbis(7-diethylaminocoumarin), bis(cyclopentadienyl)-bis-[2,6-difluoro-3-(pyr-1-yl)phenyl]titanium, as well as other titanocene compounds, bisazides, etc. These may be used either singly or as combined.

Of those photo-initiators, preferred are coumarin compounds such as 7-diethylamino-3-thenoylcoumarin and 3,3-carbonylbis(7-diethylaminocoumarin), as well as titanocene compounds such as bis(cyclopentadienyl)-bis-[2,6-difluoro-3-(pyr-1-yl)phenyl]titanium, and bisazides, for use in the composition to be processed with the developer of the invention.

The amount of the photo-initiator to be in the composition may be generally from 0.01 to 30% by weight relative to the polyimide precursor therein.

The photosensitive polyimide precursor composition may optionally contain, if desired, an addition-polymerizable compound. The addition-polymerizable compound includes, for example, diethylene glycol diacrylate, triethylene glycol diacrylate, tetraethylene glycol diacrylate, diethylene glycol dimethacrylate, triethylene glycol dimethacrylate, tetraethylene glycol dimethacrylate, trimethylolpropane diacrylate, trimethylolpropane triacrylate, trimethylolpropane dimethacrylate, trimethylolpropane trimethacrylate, 1,4-butanediol diacrylate, 1,6-hexanediol diacrylate, 1,4-butanediol dimethacrylate, 1,6-hexanediol dimethacrylate, pentaerythritol triacrylate, pentaerythritol tetraacrylate, pentaerythritol trimethacrylate, pentaerythritol tetramethacrylate, styrene, divinylbenzene, 4-vinyltoluene, 4-vinylpyridine, N-vinylpyrrolidone, 2-hydroxyethyl acrylate, 2-hydroxyethyl methacrylate, 1,3-acryloyloxy-2-hydroxypropane, 1,3-methacryloyloxy-2-hydroxypropane, methylenebisacrylamide, N,N-dimethylacrylamide, N-methylolacrylamide, etc. These may be used either singly or as combined. The amount of the addition-polymerizable compound to be in the composition may be generally from 1 to 200% by weight relative to the amount of the polyimide precursor therein.

If desired, a radical polymerization inhibitor or retardant may be added to the photosensitive polyimide precursor composition in order to improve the storage stability of the composition.

The radical polymerization inhibitor or retardant includes, for example, p-methoxyphenol, diphenyl-p-benzoquinone, benzoquinone, hydroquinone, pyrogallol, phenothiazine, resorcinol, orthodinitrobenzene, paradinitrobenzene, metadinitrobenzene, phenanthraquinone, N-phenyl-1-naphthylamine, N-phenyl-2-naphthylamine, cupferron, phenothiazine, 2,5-toluquinone, tannic acid, parabenzylaminophenol, nitrsoamine, etc. These may be used either singly or as combined. The amount of the radical polymerization inhibitor or retardant, if any, in the composition may be generally from 0.01 to 30% by weight relative to the amount of the polyimide precursor therein.

The photosensitive polyimide precursor composition to be processed with the developer of the invention may contain any other additives that are known to be in photosensitive resin compositions, such as plasticizer, adhesion promoter, etc.

In the patterning method of the invention, the photosensitive polyimide precursor composition noted above is first applied onto a substrate, such as a silicon wafer, a metal substrate, a glass substrate, a ceramic substrate or the like, through dipping, spraying, screen-printing, rotary-coating or the like, and then a major part of the solvent is removed by hot drying to give a non-adhesive film. The film is then exposed to active rays or chemical radiations via a mask having a desired pattern drawn thereon. The active rays or chemical radiations for exposure include, for example, ultraviolet rays, far-ultraviolet rays, visible rays, electron rays, X-rays, single-wavelength rays (g-ray, I-ray, etc.). After the exposure, the non-exposed area of the film is removed by dissolving it with the developer of the invention to from an intended relief pattern on the substrate.

For processing the exposed film with the developer of the invention, employed is any of a dipping method, a spraying method, a paddling method and the like, which may be combined, if desired. The developed film may be rinsed with water or with a bad solvent, if desired. The rinsing liquid shall have high affinity for the developer. For this, for example, used is a bad solvent to polyimide precursors. The rinsing liquid includes, for example, water, methyl alcohol, ethyl alcohol, isopropyl alcohol, toluene, xylene, acetone, methyl ethyl ketone, diethyl ketone, ethyl acetate, ethylene glycol monoethyl ether, propylene glycol monoethyl ether, etc.

The relief pattern thus formed in the manner mentioned above is heated at a temperature falling between 80 and 400° C. for 5 to 300 minutes to cause imido ring closure therein, whereby is obtained a stable polyimide pattern with high heat resistance.

The invention is described in more detail with reference to the following Examples, which, however, are not intended to restrict the scope of the invention.

EXAMPLE 1

Preparation of Developer for Photosensitive Polyimide Precursors 40 g of dimethylsulfoxide (polar component solubility parameter, $\delta P=8$, hydrogen-bond component solubility parameter, $\delta H=5$, dipole moment=4.3, vapor pressure=0.59 mmHg (at 25° C.)), 52 g of y-butyrolactone (polar component solubility parameter, $\delta P=8.1$, hydrogen-bond component solubility parameter, $\delta H=3.6$, dipole moment=4.1, vapor pressure=0.1 5 mmHg (at 25° C.)), and 8 g of water (polar component solubility parameter, $\delta P=7.8$, hydrogen-bond component solubility parameter, $\delta H=20.7$, dipole moment=1.9, vapor pressure=23.8 mmHg (at 25° C.)) were put into a three-neck flask equipped with a stirrer, a thermometer and a nitrogen-introducing duct. These were stirred at room temperature for 1 hour to obtain a mixed solution (developer for photosensitive polyimide precursors) of dimethylsulfoxide/γ-butyrolactone/water (40/5218, by weight).

Production of Polyamic Acid Solution 10 g of 2,2'-dimethyl-4,4'-diaminobiphenyl and 70 g of N-methyl-2-pyrrolidone were put into a three-neck flask equipped with a stirrer, a thermometer and a nitrogen-introducing duct, and stirred at room temperature into a solution. 15 g of hydroxydiphthalic acid dianhydride was added to this, and stirred for 8 hours to prepare a viscous, polyamic acid resin solution.

Patterning 10 g of the polyamic acid resin solution prepared in the above was stirred, to which were added photosensitizers of 0.02 g of bis(cyclopentadienyl)-bis-[2,6-difluoro-3-(pyr-1-yl)phenyl]titanium, 0.02 g of 2,6-bis(4'-azidobenzal)-4-carboxycyclohexanone and 1.5 g of 3-dimethylaminopropyl methacrylate, and stirred and dissolved. The resulting mixture was filtered to obtain a photosensitive resin composition solution. This solution was dripped onto a silicon wafer, which was thus coated with it through spin-coating. Next, the thus-coated silicon wafer was heated on a hot plate at 90° C. for 200 seconds, thereby forming a film having a thickness of 20 μm on the wafer. This was then exposed to light via a patterning mask, for which was used an i-ray stepper. Next, this was heated at 120° C. for 60 seconds, then developed by paddling with the mixed solution of dimethylsulfoxide/y-butyrolactone/water (40/52/8, by weight) that had been prepared previously, and thereafter rinsed with ethanol. In the process, the resolution reached 10 μm (in terms of the minimum via hole diameter), and the relief pattern formed had an extremely good profile. The standard deviation in the pattern dimension of 10 μm was 0.3 μm (for this, two lines were drawn on the 5-inch wafer, passing through the center point of wafer while being perpendicular to each other, and the center point of the wafer, and the nearly center point and the nearly end point of each of the four lines extending from the center point of the wafer (that is, two points in each line), totaling 9 points in the wafer were measured with a metallic microscope equipped with a length-measuring tool—the same shall apply hereinunder). It was confirmed that the mixed solution used herein had a polar component solubility parameter, $\delta P$, of 8.0 and a hydrogen-bond component solubility parameter, $\delta H$, of 5.7.

EXAMPLE 2

The same process as in Example 1 was repeated herein, except that a mixed solution of dimethylsulfoxide/γ-butyrolactone/water (50/40/10, by weight) was used in place of the mixed solution of dimethylsulfoxide/y-butyrolactone/water (40152/8, by weight) used in Example 1. A relief pattern having a good profile was obtained herein, and its resolution reached 20 μm (in terms of the minimum via hole diameter). The standard deviation in the pattern dimension of 20 μm was 0.2 μm. It was confirmed that the mixed solution used herein had a polar component solubility parameter, $\delta P$, of 8.0 and a hydrogen-bond component solubility parameter, $\delta H$, of 6.2.

EXAMPLE 3

The same process as in Example 1 was repeated herein, except that a mixed solution of dimethylsulfoxide/γ-butyrolactone/water (35/58/7, by weight) was used in place of the mixed solution of dimethylsulfoxide/y-butyrolactone/water (40/52/8, by weight) used in Example 1. A relief pattern having a good profile was obtained herein, and its resolution reached 20 μm (in terms of the minimum via hole diameter). The standard deviation in the pattern dimension of 20 μm was 0.2 μm. It was confirmed that the mixed solution used herein had a polar component solubility parameter, $\delta P$, of 8.0 and a hydrogen-bond component solubility parameter, $\delta H$, of 5.4.

COMPARATIVE EXAMPLE 1

The same process as in Example 1 was repeated herein, except that a mixed solution of N-methyl-2-pyrrolidone (polar component solubility parameter, $\delta P=6$, hydrogen-bond component solubility parameter, $\delta H=3.5$, dipole moment=4.1, vapor pressure=0.23 mmHg (at 25° C.))/y-butyrolactone/water (70/20/1 0, by weight) was used in place of the mixed solution of dimethylsulfoxide/γ-butyrolactone/water (40/52/8, by weight) used in Example 1. In this, however, the film was dissolved insufficiently as the development time was short, and no pattern was formed at all. It was confirmed that the mixed solution used herein had a polar component solubility parameter, $\delta P$, of 6.6 and a hydrogen-bond component solubility parameter, $\delta H$, of 5.3.

COMPARATIVE EXAMPLE 2

The same process as in Example 1 was repeated herein, except that a mixed solution of N-methyl-2-pyrrolidone/methanol (vapor pressure=123.5 mmHg (at 25° C.)) (80/20, by weight) was used in place of the mixed solution of dimethylsulfoxide/y-butyrolactone/water (40/52/8, by weight) used in Example 1. In this, however, the film was dissolved insufficiently as the development time was short. As a result, residues remained in the pattern (for via holes) formed. When the development time was prolonged to 180 seconds, no residue remained in the pattern formed, and the resolution of the pattern reached 20 μm. However, the pattern dimension greatly fluctuated, and the standard deviation in the pattern dimension of 20 μm was 1.5 μm. N-methyl-2-pyrrolidone and methanol constituting the mixed solution used herein both had a polar component solubility parameter, δP, of 6, and it was confirmed that the mixed solution had a polar component solubility parameter, δP, of 6 and a hydrogen-bond component solubility parameter, δH, of 5.3.

COMPARATIVE EXAMPLE 3

The same process as in Example 1 was repeated herein, except that a mixed solution of dimethylsulfoxide/N-methyl-2-pyrrolidone/water (10/70/20, by weight) was used in place of the mixed solution of dimethylsulfoxide/γ-butyrolactone/water (40/52/8, by weight) used in Example 1. In this, however, the film was dissolved insufficiently as the development time was short, and no pattern was formed at all. It was confirmed that the mixed solution used herein had a polar component solubility parameter, δP, of 6.6 and a hydrogen-bond component solubility parameter, δH, of 7.2.

COMPARATIVE EXAMPLE 4

The same process as in Example 1 was repeated herein, except that a mixed solution of dimethylsulfoxide/isopropyl alcohol (30/70, by weight) was used in place of the mixed solution of dimethylsulfoxide/γ-butyrolactone/water (40/52/8, by weight) used in Example 1. In this, however, no pattern was formed at all. The mixed solution used herein had a polar component solubility parameter, δP, of 4.2 and a hydrogen-bond component solubility parameter, δH, of 7.3.

COMPARATIVE EXAMPLE 5

The same process as in Example 1 was repeated herein, except that a mixed solution of γ-butyrolactone/isopropyl alcohol (50/50, by weight) was used in place of the mixed solution of dimethylsulfoxide/γ-butyrolactone/water (40/52/8, by weight) used in Example 1. In this, however, no pattern was formed at all. The mixed solution used herein had a polar component solubility parameter, δP, of 5.1 and a hydrogen-bond component solubility parameter, δH, of 6.2.

COMPARATIVE EXAMPLE 6

The same process as in Example 1 was repeated herein, except that a mixed solution of N-methyl-2-pyrrolidone/water (80/20, by weight) was used in place of the mixed solution of dimethylsulfoxide/y-butyrolactone/water (40/52/8, by weight) used in Example 1. In this, however, no pattern was formed at all. The mixed solution used herein had a polar component solubility parameter, δP, of 6.4 and a hydrogen-bond component solubility parameter, δH, of 7.0.

COMPARATIVE EXAMPLE 7

The same process as in Example 1 was repeated herein, except that γ-butyrolactone only was used in place of the mixed solution of dimethyl-sulfoxide/γ-butyrolactone/water (40/52/8, by weight) used in Example 1. In this, however, the film was not dissolved at all, and no pattern was formed.

COMPARATIVE EXAMPLE 8

The same process as in Example 1 was repeated herein, except that water only was used in place of the mixed solution of dimethylsulfoxide/ γ-butyrolactone/water (40/52/8, by weight) used in Example 1. In this, however, the film was not dissolved at all, and no pattern was formed.

COMPARATIVE EXAMPLE 9

The same process as in Example 1 was repeated herein, except that dimethylsulfoxide only was used in place of the mixed solution of dimethylsulfoxide/γ-butyrolactone/water (40/52/8, by weight) used in Example 1. In this, however, the pattern formed was cracked and peeled, and it was impracticable.

As has been described in detail hereinabove, the developer for photosensitive polyimide precursors of the invention is favorable to rapid polyimide patterning, for example, for interlayer insulating films for multi-layered circuit boards and for α-ray shield layers, buffer coat layers and others for semiconductor memory devices. With the developer, the polyimide patterning is attained within a short period of time.

As exhibiting the effect, the developer is characterized in that the polyimide patterns formed with it have the advantage of little fluctuation in patterning dimensions.

The developer is further characterized in that it gives no residues after development with it, and that the difference in the solution velocity between the exposed area and the non-exposed area being developed with it is great enough to give high-resolution patterns.

According to the patterning method of the invention of using the developer for polyimide patterning for interlayer insulating films for multi-layered circuit boards and for α-ray shield layers, buffer coat layers and others for semiconductor memory devices, the polyimide patterning with the developer is attained within a shorter period of time than with conventional developers, and, in addition, the developer used gives no residues after development with it, and the polyimide patterns formed have the advantage of little fluctuation in patterning dimensions.

While the invention has been described in detail and with reference to specific embodiments thereof, it will be apparent to one skilled in the art that various changes and modifications can be made therein without departing from the spirit and scope thereof.

What is claimed is:

1. A developer for photosensitive polyimide precursors, which comprises two or more solvents including at least an aprotic polar solvent, and in which the mixed solution of the solvents has a polar component solubility parameter, δP, of not smaller than 7.

2. The developer for photosensitive polyimide precursors as claimed in claim 1, which comprises at least two or more solvents and in which the mixed solution of the solvents has a polar component solubility parameter, δP, falling between 7 and 9, and a hydrogen-bond component solubility parameter, δH, falling between 5 and 7.

3. The developer for photosensitive polyimide precursors as claimed in claim 1, wherein each solvent has a vapor pressure of not higher than 30 mmHg (at 25° C.).

4. The developer for photosensitive polyimide precursors as claimed in claim 1, wherein each solvent has a polar component solubility parameter, δP, of not smaller than 7.

5. The developer for photosensitive polyimide precursors as claimed in claim 1, which comprises two aprotic polar solvents each having a dipole moment of not smaller than 3.8, in a compositional ratio falling between 0.5 and 2.0, along with water.

6. The developer for photosensitive polyimide precursors as claimed in claim 5, wherein the aprotic polar solvents are in an amount of from 80 to 95% by weight, and water is in an amount of 5 to 12% by weight.

7. The developer for photosensitive polyimide precursors as claimed in claim 6, wherein the aprotic polar solvents are dimethylsulfoxide and γ-butyrolactone, the amount of dimethylsulfoxide is from 30 to 70% by weight, that of γ-butyrolactone is from 30 to 70% by weight, that of water is from 5 to 12% by weight, and the ratio by weight of dimethylsulfoxide/γ-butyrolactone falls between 0.6 and 1.5.

8. A patterning method comprising exposing a film of a photosensitive polyimide precursor composition to active rays via a pattern mask therebetween, followed by processing the film with a developer to thereby remove the non-exposed area of the film, wherein the developer used comprises two or more solvents including at least an aprotic polar solvent, and the mixed solution of the solvents for the developer has a polar component solubility parameter, $\delta P$, of not smaller than 7.

* * * * *